United States Patent
Kachi et al.

(10) Patent No.: US 7,491,432 B2
(45) Date of Patent: Feb. 17, 2009

(54) CERAMIC SUSCEPTOR FOR SEMICONDUCTOR MANUFACTURING EQUIPMENT

(75) Inventors: Yoshifumi Kachi, Itami (JP); Akira Kuibira, Itami (JP); Hirohiko Nakata, Itami (JP)

(73) Assignee: Sumitomo Electric Industries, Ltd., Osaka (JP)

(*) Notice: Subject to any disclaimer, the term of this patent is extended or adjusted under 35 U.S.C. 154(b) by 463 days.

(21) Appl. No.: 10/605,764

(22) Filed: Oct. 24, 2003

(65) Prior Publication Data
US 2006/0177697 A1   Aug. 10, 2006

(30) Foreign Application Priority Data
Oct. 24, 2002   (JP)  ............... 2002-309385

(51) Int. Cl.
*B32B 9/00*   (2006.01)
(52) U.S. Cl. .................. 428/34.4; 428/469; 428/701; 428/702
(58) Field of Classification Search .............. None
See application file for complete search history.

(56) References Cited

U.S. PATENT DOCUMENTS 5,231,690 A * 7/1993 Soma et al. ................. 392/416

FOREIGN PATENT DOCUMENTS

| JP | H06-28258 B2 | 4/1992 |
|----|--------------|--------|
| JP | H07-230876 A | 8/1995 |
| JP | 2000-114354 A | 4/2000 |
| JP | 2000-290773 | * 10/2000 |
| JP | 2000-290773 A | 10/2000 |
| JP | 2002-134484 A | 5/2002 |

OTHER PUBLICATIONS

Machine translation of JP 2002-134484, cited on applicant's IDS.*

* cited by examiner

*Primary Examiner*—Timothy M Speer
(74) *Attorney, Agent, or Firm*—James W. Judge

(57) ABSTRACT

For semiconductor manufacturing equipment, a ceramic susceptor that without occurrence of cracking in the course of heating wafers suppresses thermal radiation from the circumferential surface of a wafer placed on the ceramic susceptor, to heighten isothermal quality in the wafer face. A semiconductor-manufacturing-equipment ceramic susceptor (1) including a resistive heating element (3) in the face or interior of ceramic substrates (2a, 2b) has a wafer pocket (5) consisting of a recess that can accommodatingly carry a wafer. The angle that the perimetric inside surface and the bottom face of the wafer pocket (5) form is over 90° and 170° or less, and/or the curvature of the bottom-portion circumferential rim where the perimetric inside surface and the bottom face of the pocket join is 0.1 mm or more. A plasma electrode furthermore may be disposed in the face or interior of the ceramic substrates (2a, 2b) of the ceramic susceptor (1).

8 Claims, 1 Drawing Sheet

CERAMIC SUSCEPTOR FOR SEMICONDUCTOR MANUFACTURING EQUIPMENT

BACKGROUND OF INVENTION

1. Field of the Invention

The present invention relates to ceramic susceptors employed to retain and heat wafers in semiconductor manufacturing equipment in which predetermined processes are carried out on the wafers in the course of semiconductor manufacture.

2. Description of the Background Art

A variety of structures for ceramic susceptors employed in semiconductor manufacturing equipment has been proposed to date.

For example, a semiconductor wafer heating device equipped with a ceramic susceptor in which a resistive heating element is embedded and that is installed within a reaction chamber, and with a pillar-like support member provided on a surface of the susceptor apart from its wafer-heating face and that forms a gastight seal between it and the chamber, is proposed in Japanese Pre-Grant Pub. No. H06-28258.

In order to reduce manufacturing costs meanwhile, a transition to wafers of larger diametric span—from 8-inch to 12-inch in outer diameter—is in progress, along with which the ceramic susceptors that retain the wafers are turning out to be 300 mm diameter or more. At the same time isothermal ratings within ±1.0%, more desirably within ±0.5%, in the face of wafers being heated by the ceramic susceptors are being called for.

In response to demands for enhanced isothermal properties as such, research has been made into improvements in the circuit patterns for the resistive heating elements provided in ceramic susceptors. Consequent on the enlarging of the diametric span of wafers and ceramic susceptors, however, realizing the demands just mentioned in terms of wafer-surface isothermal quality is proving to be difficult.

The ceramic-susceptor face that carries a wafer is typically formed as a simple plane, wherein a semiconductor wafer is retained and heated atop the flat wafer-retaining face. Nevertheless, because there is thermal radiation from the circumferential surface of a wafer set on the ceramic susceptor, the temperature of the wafer periphery is liable to be low compared with the wafer interior. As a consequence, the thermal radiation from the wafer circumferential surface is likely to impair the isothermal quality of the wafer face, and this problem has grown pronounced as the enlargement in diametric span progresses.

A further problem is that if a process is performed on the ceramic susceptor to form screw holes in it, with those portions as engendering points, cracking is liable to arise in the susceptor in the course of heating wafers. To eliminate any separation between the susceptor face on its wafer-retaining side and a wafer is therefore why the susceptor face in particular has been rendered a simple plane without subjecting it to any special process.

SUMMARY OF INVENTION

An object of the present invention, in consideration of former circumstances of this sort, is to realize for semiconductor manufacturing equipment a ceramic susceptor that with no incidents of cracking in the course of heating wafers suppresses thermal radiation from the circumferential surface of a wafer set on the ceramic susceptor, to heighten the isothermal quality in the wafer face.

In order to accomplish the object stated above, the present invention renders a ceramic susceptor for semiconductor manufacturing equipment, being a semiconductor-manufacturing-equipment ceramic susceptor having a resistive heating element in the surface or interior of its ceramic substrate, and characterized in having, in the ceramic-susceptor face on its wafer-retaining side, a recess with room to carry a wafer; in that the angle that the perimetric inside surface and the bottom face of the recess form is over 90° and 170° or less; and/or in that the curvature of the bottom-portion circumferential verge where the perimetric inside surface and the bottom face of the recess join is 0.1 mm or more.

In the foregoing semiconductor-manufacturing-equipment ceramic susceptor of the present invention, the ceramic substrate preferably is made of at least one selected from aluminum nitride, silicon nitride, aluminum oxynitride, and silicon carbide.

Likewise, in the foregoing semiconductor-manufacturing-equipment ceramic susceptor of the present invention, the resistive heating element is preferably made from at least one selected from tungsten, molybdenum, platinum, palladium, silver, nickel, and chrome.

In addition, a plasma electrode furthermore may be disposed in the surface or interior of the ceramic substrate for the foregoing semiconductor-manufacturing-equipment ceramic susceptor of the present invention.

From the following detailed description in conjunction with the accompanying drawings, the foregoing and other objects, features, aspects and advantages of the present invention will become readily apparent to those skilled in the art.

DETAILED DESCRIPTION

As a result of investigating means for suppressing heat radiation from the circumferential surface of a wafer, the present inventors took note of the ways in which wafers are set onto ceramic susceptors for semiconductor manufacturing equipment, and came up with providing a recess that can accommodatingly carry a wafer (hereinafter also referred to as a "wafer pocket") in the face of the ceramic susceptor on its wafer-retaining side.

Here, as far as the form of the wafer pocket is concerned, it may be sunken to an extent lower than the ceramic-susceptor face on its wafer-retaining side, and may have a flat bottom face of size to allow for accommodatingly carrying a wafer—for example, the wafer pocket preferably is a circular depression whose outer diameter is approximately the same as that of the wafer, but is not thereby limited.

Figure 1:
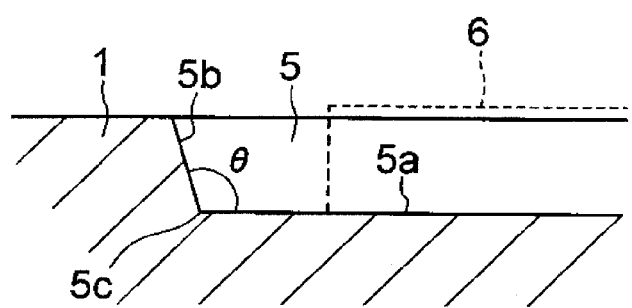
FIG. 1 is an outline sectional view illustrating a portion of a specific example of a wafer pocket provided in the wafer-carrying-face side of a ceramic susceptor in the present invention.

For example, as illustrated in FIG. 1, a wafer pocket 5 consisting of a recess having a depth that is about the same as the thickness extent of a wafer 6 is provided in a ceramic susceptor 1. Placing the wafer 6 onto the flat bottom face 5a of the wafer pocket 5 accommodates the wafer 6 within the wafer pocket 5 and put the wafer 6 into a situation in which the entirety or the major portion of its circumferential surface opposes the circumferential inside face 5b of the wafer pocket 5, which therefore reduces the radiation of heat from the circumferential surface of, and makes for heightened isothermal quality in, the wafer 6.

Bettering and enhancing isothermal quality in the face of a wafer when in the process of being heated is enabled in the present invention, even with wafers and ceramic susceptor of large diametric span. To be specific, the wafer superficial isothermal rating can be rendered ±0.5% with ceramic susceptors of 100 W/mK or greater thermal conductivity, and ±1.0% with ceramic susceptors of 10 to 100 W/mK or greater thermal conductivity.

Nevertheless, freshly providing a wafer pocket of this sort in a ceramic susceptor can, with the discontinuity at the wafer pocket as the starting point, lead to cracking when the temperature is elevated to the 500° C. or more that is the heater temperature in use. Such cracking presumably arises from thermal stress by heat gathering at the pocket discontinuity in the wafer because the gap between the circumferential inside face of the wafer pocket and the wafer is small.

Given the circumstances, then, a wafer pocket contour that would not bring about cracking in the ceramic susceptor, yet ensure isothermal quality in the wafer face, was investigated. The result was that when, as illustrated in FIG. 1, the angle θ that the circumferential inside face 5b and the bottom face 5a of the wafer pocket 5 form is over 90° and 170° or less, cracking in the ceramic susceptor 1 with the discontinuity at the wafer pocket 5 being the originating point can be prevented at the same time the required isothermal quality in the wafer face is maintained. By the same token, an instance in which the curvature R of the bottom-portion circumferential verge 5c where the circumferential inside face 5b and the bottom face 5a of the wafer pocket 5 join was rendered 0.1 mm or more yielded similar efficacy.

Figure 2:
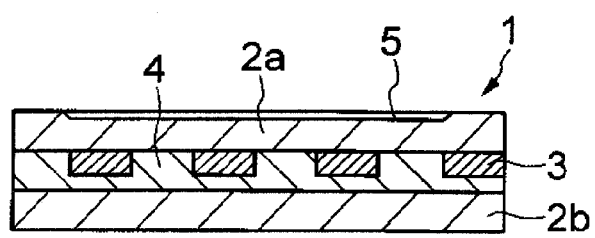
FIG. 2 is an outline sectional view illustrating a specific example of a ceramic susceptor according to the present invention.

Next, the specific structure of a ceramic susceptor according to the present invention will be explained with reference to FIGS. 2 and 3. The ceramic susceptor 1 represented in FIG. 2 is furnished with a resistive heating element 3, having a predetermined circuit pattern, over a surface of a ceramic substrate 2a, and a separate ceramic substrate 2b is joined onto that surface by means of an adhesive layer 4 consisting of glass or ceramic. Here, the circuit pattern for the resistive heating element 3 is formed, for example, so that the line width and interlinear spacing are 5 mm or less, and more preferably, 1 mm or less.

Figure 3:
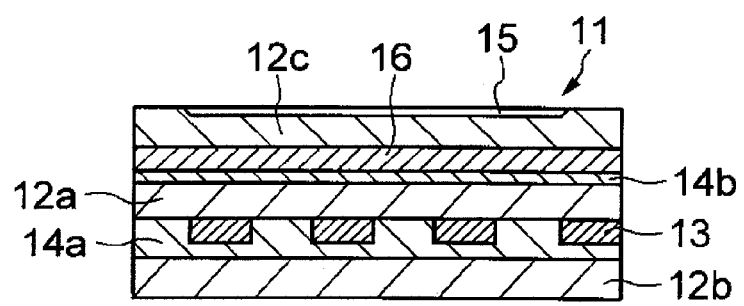
FIG. 3 is an outline sectional view illustrating a separate specific example of a ceramic susceptor according to the present invention.

Likewise, a ceramic susceptor 11 that is represented in FIG. 3 is interiorly equipped with a resistive heating element 13 and with a plasma electrode 16. In particular, a ceramic substrate 12a including a resistive heating element 13 on one face thereof, and a ceramic substrate 12b are joined, in the same way as with the ceramic susceptor of FIG. 2, by an adhesive layer 14a; and meanwhile a separate ceramic substrate 12c, on which the plasma electrode 16 is provided, is joined by means of an adhesive layer 14b consisting of glass or ceramic to the other face of the ceramic substrate 12a.

A recess (wafer pocket 5 or 15) with room to carry a wafer is then furnished in the ceramic susceptor 1 or 11 of either of the foregoing FIG. 2 or 3, in the face on the wafer-carrying side.

It should be understood that in manufacturing the ceramic susceptors represented in FIGS. 2 and 3, apart from the method of joining the respective ceramic substrates, green sheets of approximately 0.5 mm thickness may be prepared, and after print-coating an electrically conductive paste into circuit patterns for a resistive heating element and/or a plasma electrode onto the green sheets, these green sheets and, as needed, ordinary green sheets may be laminated to produce the required thickness, and made unitary by sintering them simultaneously.

EMBODIMENTS

Embodiment 1

A sintering promoter and a binder were added to, and, using a ball mill, dispersed into and mixed with, aluminum nitride (AlN) powder. After drying it with a spray dryer, the powder blend was press-molded into discoid plates of 380 mm diameter and 10 mm thickness. AlN sinters were produced by degreasing, within a non-oxidizing atmosphere at temperature of 800° C., the molded objects obtained and then sintering them 4 hours at a temperature of 1900° C. The thermal conductivity of the AlN sinters was 170 W/mK. The circumferential surface of the AlN sinters was polished to bring their outer diameter down to 330 mm, whereby disk pairs of AlN substrates for ceramic susceptors were prepared.

A paste, being tungsten powder and a sintering promoter knead-mixed into a binder, was print-coated to form a predetermined heating-element circuit pattern onto a face of first disks from the AlN substrate pairs. Resistive heating elements of tungsten were formed by degreasing these AlN substrates within a non-oxidizing atmosphere at a temperature of 800° C., and then sintering them 4 hours at a temperature of 1700° C. In addition a paste, in which a $Y_2O_3$ adhesive agent and a binder were knead-mixed, was print-coated onto a face of the remaining, second disks from the foregoing AlN substrate pairs, which were then degreased at a temperature of 500° C. This adhesive-agent layer on the AlN second substrate disks was overlaid onto the face of the first AlN substrate disks where the resistive heating element was formed, and the first/second disk pairs were bonded together by heating them at a temperature of 1800° C.

A recess (wafer pocket) of depth equal to that of a wafer 0.8 mm thick and whose diameter was 315 mm was machined into the face on the wafer-carrying side of the post-bonded items. In doing so, the items were processed so that the angle θ that the wafer-pocket circumferential inside face and the wafer-pocket bottom face form would for each sample be a respective one of given angles set forth in the following Table I. In addition, on some of the samples, the bottom-portion circumferential verge where the wafer-pocket circumferential inside face and the wafer-pocket bottom face join was machined into a curved surface having the curvature R set forth in Table I. Each of the sample AlN-ceramic susceptors (of FIG. 2 structure) set forth in Table I below was produced in this way.

Ceramic-susceptor temperature was elevated to 500° C. by passing an electric current at a voltage of 200 V into the resistive heating element of each of the sample ceramic susceptors produced, through two electrodes that were formed on the susceptor surface on the side opposite the wafer-carrying face. Therein, a silicon wafer of 0.8 mm thickness and 304 mm diameter was laid in the wafer pocket in the ceramic susceptors, and the surface temperature distribution was measured to find the isothermal rating. The results obtained are given by sample in Table I below.

TABLE I

| Sample | Angle θ and curvature R (mm) | Wafer-surface isothermal rating (%) at 500° C. | Presence of cracking (N = 5) |
|---|---|---|---|
| 1* | No wafer pocket | 0.78 | — |
| 2* | θ = 80; no R | 0.40 | 3/5 |
| 3* | θ = 90; no R | 0.37 | 2/5 |
| 4 | θ = 90; R = 0.1 | 0.38 | 0/5 |
| 5 | θ = 91; no R | 0.38 | 0/5 |
| 6 | θ = 91; R = 0.1 | 0.37 | 0/5 |
| 7 | θ = 110; no R | 0.40 | 0/5 |
| 8 | θ = 135; no R | 0.43 | 0/5 |
| 9 | θ = 150; no R | 0.45 | 0/5 |
| 10 | θ = 170; no R | 0.48 | 0/5 |
| 11* | θ = 175; no R | 0.64 | 0/5 |

Note:
Samples marked with an asterisk (*) in the table are comparative examples.

As will be understood from the results set forth in Table I above, in ceramic susceptors made of aluminum nitride, by forming a wafer pocket in the wafer-carrying face and either making the angle θ that the wafer-pocket circumferential inside face and the wafer-pocket bottom face form be 90°<θ≦170°, or providing at the circumferential verge of the bottom portion of the wafer pocket a curved surface whose curvature R is R≧0.1 mm, the isothermal rating in the face of a wafer when the wafer is heated can be brought to within ±0.5%, without occurrence of cracking in the ceramic susceptors.

Embodiment 2

A sintering promoter and a binder were added to, and, using a ball mill, dispersed into and mixed with, silicon nitride ($Si_3N_4$) powder. After drying it with a spray dryer, the powder blend was press-molded into discoid plates of 380 mm diameter and 10 mm thickness. $Si_3N_4$ sinters were produced by degreasing, within a non-oxidizing atmosphere at temperature of 800° C., the molded objects and then sintering them 4 hours at a temperature of 1550° C. The thermal conductivity of the obtained $Si_3N_4$ sinters was 20 W/mK. The circumferential surface of the $Si_3N_4$ sinters was polished to bring their outer diameter down to 330 mm, whereby disk pairs of $Si_3N_4$ substrates for ceramic susceptors were prepared.

Resistive heating elements were formed by print-coating a paste, being tungsten powder and a sintering promoter knead-mixed with a binder, onto a face of first disks from the $Si_3N_4$ substrate pairs and, after degreasing them within a non-oxidizing atmosphere at a temperature of 800° C., sintering them at a temperature of 1650° C. In addition, an $SiO_2$ adhesive-agent layer was formed on a face of the remaining, second disks from the foregoing $Si_3N_4$ substrate pairs, which after being degreased at a temperature of 500° C. were overlaid onto the face of the first $Si_3N_4$ substrate disks on which the resistive heating element was formed, and the first/second disk pairs were bonded together by heating them at a temperature of 800° C.

A wafer pocket of depth equal to that of a wafer 0.8 mm thick and whose diameter was 315 mm was machined into the face on the wafer-carrying side of the post-bonded items. In doing so, the items were processed likewise as with Embodiment 1, and sample by sample the angle θ that the wafer-pocket circumferential inside face and the wafer-pocket bottom face form, and the curvature R of the bottom-portion circumferential verge where the wafer-pocket circumferential inside face and the wafer-pocket bottom face join was varied as set forth in the following Table II.

Ceramic-susceptor temperature was elevated to 500° C. by passing an electric current at a voltage of 200 V into the resistive heating element of each of the thus obtained $Si_3N_4$ ceramic susceptors, through two electrodes that were formed on the susceptor surface on the side opposite the wafer-carrying face. Therein, a silicon wafer of 0.8 mm thickness and 304 mm diameter was laid in the wafer pocket in the ceramic susceptors, and the surface temperature distribution was measured to find the isothermal rating. The results obtained are given by sample in Table II below.

TABLE II

| Sample | Angle θ and curvature R (mm) | Wafer-surface isothermal rating (%) at 500° C. | Presence of cracking (N = 5) |
|---|---|---|---|
| 12* | θ = 80; no R | 0.81 | 4/5 |
| 13 | θ = 90; no R | 0.75 | 3/5 |
| 14 | θ = 90; R = 0.1 | 0.76 | 0/5 |
| 15 | θ = 91; no R | 0.76 | 0/5 |
| 16 | θ = 91; R = 0.1 | 0.74 | 0/5 |
| 17 | θ = 110; R = 0.1 | 0.80 | 0/5 |
| 18 | θ = 135; no R | 0.86 | 0/5 |
| 19 | θ = 150; no R | 0.90 | 0/5 |
| 20 | θ = 170; no R | 0.96 | 0/5 |
| 21* | θ = 175; no R | 1.28 | 0/5 |

Note:
Samples marked with an asterisk (*) in the table are comparative examples.

As will be understood from Table II above, also in ceramic susceptors made of silicon nitride, by either making the angle that the circumferential inside face of a wafer pocket, shaped in the susceptor wafer-carrying face, and the bottom face of the wafer pocket form be 90°<θ≦170°, or the curvature R of the circumferential verge of the bottom portion of the wafer pocket be R≧0.1 mm, the isothermal rating in the face of wafers during wafer heating can be brought to within ±1.0%, without occurrence of cracking in the ceramic susceptors.

Embodiment 3

A sintering promoter and a binder were added to, and, using a ball mill, dispersed into and mixed with, aluminum oxynitride (AlON) powder. After drying it with a spray dryer, the powder blend was press-molded into discoid plates of 380 mm diameter and 10 mm thickness. AlON sinters were produced by degreasing, within a non-oxidizing atmosphere at temperature of 800° C., the molded objects and then sintering them 4 hours at a temperature of 1770° C. The thermal conductivity of the obtained AlON sinters was 20 W/mK. The circumferential surface of the AlON sinters was polished to bring their outer diameter down to 330 mm, whereby disk pairs of AlON substrates for ceramic susceptors were prepared.

A paste, being tungsten powder and a sintering promoter knead-mixed into a binder, was print-coated to form a predetermined heating-element circuit pattern onto a face of first disks from the AlON substrate pairs. Resistive heating elements were formed by degreasing these AlON substrates within a non-oxidizing atmosphere at a temperature of 800° C., and sintering them at a temperature of 1700° C. In addition, a paste, in which a $Y_2O_3$ adhesive agent and a binder were knead-mixed, was print-coated onto a face of the remaining, second disks from the foregoing AlON substrate pairs, which were then degreased at a temperature of 500° C. This adhesive layer on the AlON second substrate disks was overlaid onto the face of the first AlN substrate disks where the resistive heating element was formed, and the first/second disk pairs were bonded together by heating them at a temperature of 1800° C.

A wafer pocket of depth equal to that of a wafer 0.8 mm thick and whose diameter was 315 mm was machined into the face on the wafer-carrying side of the post-bonded items. In doing so, the items were processed likewise as with Embodiment 1, and sample by sample the angle θ that the wafer-pocket circumferential inside face and the wafer-pocket bottom face form, and the curvature R of the bottom-portion circumferential verge where the wafer-pocket circumferential inside face and the wafer-pocket bottom face join was varied as set forth in the following Table III.

Ceramic-susceptor temperature was elevated to 500° C. by passing an electric current at a voltage of 200 V into the resistive heating element of each of the thus obtained AlON ceramic susceptors, through two electrodes that were formed on the susceptor surface on the side opposite the wafer-carrying face. Therein, a silicon wafer of 0.8 mm thickness and 304 mm diameter was laid in the wafer pocket in the ceramic susceptors, and the surface temperature distribution was measured to find the isothermal rating. The results obtained are given by sample in Table III below.

TABLE III

| Sample | Angle θ and curvature R (mm) | Wafer-surface isothermal rating (%) at 500° C. | Presence of cracking (N = 5) |
|---|---|---|---|
| 22* | θ = 80; no R | 0.80 | 2/5 |
| 23 | θ = 90; no R | 0.74 | 3/5 |
| 24 | θ = 90; R = 0.1 | 0.75 | 0/5 |
| 25 | θ = 91; no R | 0.75 | 0/5 |
| 26 | θ = 91; R = 0.1 | 0.74 | 0/5 |
| 27 | θ = 110; R = 0.1 | 0.80 | 0/5 |
| 28 | θ = 135; no R | 0.85 | 0/5 |
| 29 | θ = 150; no R | 0.89 | 0/5 |
| 30 | θ = 170; no R | 0.96 | 0/5 |
| 31* | θ = 175; no R | 1.29 | 0/5 |

Note:
Samples marked with an asterisk (*) in the table are comparative examples.

As will be understood from Table III above, also in ceramic susceptors made of aluminum oxynitride, by either making the angle that the circumferential inside face of a wafer pocket, shaped in the susceptor wafer-carrying face, and the bottom face of the wafer pocket form be 90°<θ≦170°, or the curvature R of the circumferential verge of the bottom portion of the wafer pocket be R≧0.1 mm, the isothermal rating in the face of wafers during wafer heating can be brought to within ±1.0%, without occurrence of cracking in the ceramic susceptors.

Embodiment 4

Disk pairs of ceramic-susceptor AlN substrates 330 mm in diameter, made out of aluminum nitride sinters, were prepared by the same method as in Embodiment 1. In utilizing the AlN substrate pairs to fabricate ceramic susceptors, the material for the resistive heating element provided was changed to Mo, to Pt, to Ag—Pd, and to Ni—Cr, and respective pastes were printed-coated onto a face of first disks from the AlN substrate pairs, which were then baked in a non-oxidizing atmosphere.

Next, an $SiO_2$ bonding glass was coated on a face of the remaining, second disks from the AlN substrate pairs, which were then degreased in a non-oxidizing atmosphere at a temperature of 800° C. This glass layer on the AlN second substrate disks was overlaid onto the face of the first AlN substrate disks where the resistive heating element was formed; and by heating the first/second disk pairs at a temperature of 800° C. to bond them together, AlN ceramic susceptors whose resistive-heating-element substances respectively differed were produced.

A wafer pocket of depth equal to that of a wafer 0.8 mm thick and whose diameter was 315 mm was machined into the face on the wafer-carrying side of each the ceramic susceptors. In doing so, the susceptors were processed likewise as with Embodiment 1, and sample by sample the angle θ that the wafer-pocket circumferential inside face and the wafer-pocket bottom face form, and the curvature R of the bottom-portion circumferential verge where the wafer-pocket circumferential inside face and the wafer-pocket bottom face join was varied as set forth in the following Table IV.

Ceramic-susceptor temperature was elevated to 500° C. by passing an electric current at a voltage of 200 V into the resistive heating element of each of the thus obtained ceramic susceptors, through two electrodes that were formed on the susceptor surface on the side opposite the wafer-carrying face. Therein, a silicon wafer of 0.8 mm thickness and 304 mm diameter was laid in the wafer pocket in the ceramic susceptors, and the surface temperature distribution was measured to find the isothermal rating. The results obtained are given by sample in Table IV below.

TABLE IV

| Sample | Resistive heating element | Angle θ and curvature R (mm) | Wafer-surface isothermal rating (%) at 500° C. | Presence of cracking (N = 5) |
|---|---|---|---|---|
| 32* | Mo | θ = 90; no R | 0.35 | 2/5 |
| 33 | Mo | θ = 90; R = 0.1 | 0.36 | 0/5 |
| 34 | Mo | θ = 91; no R | 0.36 | 0/5 |
| 35 | Mo | θ = 91 R = 0.1 | 0.36 | 0/5 |
| 36 | Mo | θ = 110 R = 0.1 | 0.39 | 0/5 |
| 37 | Mo | θ = 135; no R | 0.43 | 0/5 |
| 38 | Mo | θ = 170; no R | 0.47 | 0/5 |
| 39* | Mo | θ = 175; no R | 0.65 | 0/5 |
| 40* | Pt | θ = 90; no R | 0.37 | 3/5 |
| 41 | Pt | θ = 90 R = 0.1 | 0.38 | 0/5 |
| 42 | Pt | θ = 91; no R | 0.38 | 0/5 |
| 43 | Pt | θ = 91 R = 0.1 | 0.37 | 0/5 |
| 44 | Pt | θ = 110 R = 0.1 | 0.40 | 0/5 |
| 45 | Pt | θ = 135; no R | 0.44 | 0/5 |
| 46 | Pt | θ = 170; no R | 0.49 | 0/5 |
| 47* | Pt | θ = 175; no R | 0.68 | 0/5 |
| 48* | Ag—Pd | θ = 90; no R | 0.36 | 4/5 |
| 49 | Ag—Pd | θ = 90 R = 0.1 | 0.36 | 0/5 |
| 50 | Ag—Pd | θ = 91; no R | 0.36 | 0/5 |
| 51 | Ag—Pd | θ = 91 R = 0.1 | 0.35 | 0/5 |
| 52 | Ag—Pd | θ = 110 R = 0.1 | 0.39 | 0/5 |
| 53 | Ag—Pd | θ = 135; no R | 0.43 | 0/5 |
| 54 | Ag—Pd | θ = 170; no R | 0.47 | 0/5 |
| 55* | Ag—Pd | θ = 175; no R | 0.66 | 0/5 |
| 56* | Ni—Cr | θ = 90; no R | 0.34 | 3/5 |
| 57 | Ni—Cr | θ = 90 R = 0.1 | 0.35 | 0/5 |
| 58 | Ni—Cr | θ = 91; no R | 0.35 | 0/5 |
| 59 | Ni—Cr | θ = 91 R = 0.1 | 0.35 | 0/5 |
| 60 | Ni—Cr | θ = 110 R = 0.1 | 0.37 | 0/5 |
| 61 | Ni—Cr | θ = 135; no R | 0.43 | 0/5 |
| 62 | Ni—Cr | θ = 170; no R | 0.48 | 0/5 |
| 63* | Ni—Cr | θ = 175; no R | 0.63 | 0/5 |

Note:
Samples marked with an asterisk (*) in the table are comparative examples.

As will be understood from Table IV above, likewise as the case with the tungsten resistive heating elements demonstrated in Embodiment 1, also in ceramic susceptors whose resistive heating element is made of Mo, or Pt, or Ag—Pd, or Ni—Cr, by either making the angle θ that the circumferential inside face of a wafer pocket, shaped in the susceptor wafer-carrying face, and the bottom face of the wafer pocket form be 90°<θ≦170°, or the curvature R of the circumferential verge of the bottom portion of the wafer pocket be R≧0.1 mm, the isothermal rating in the face of wafers during wafer heating can be brought to within ±0.5%, without occurrence of cracking in the ceramic susceptors.

Embodiment 5

Utilizing a paste in which a sintering promoter, a binder, a dispersing agent and alcohol were added and knead-mixed into aluminum nitride (AlN) powder, green sheets approximately 0.5 mm in thickness were produced by molding using a doctor-blading technique.

Next, after drying the green sheets 5 hours at 80° C. a resistive-heating-element layer in a given circuit pattern was formed by print-coating a paste in which tungsten powder and a sintering promoter were knead-mixed with a binder onto a face of single plies of the green sheets. In addition, a plasma electrode layer was formed by print-coating the tungsten paste just described onto a face of separate single plies of the green sheets that had been likewise dried. These green sheets having electrically conductive layers in 2 plies were laminated, into a total 50 plies, with green sheets on which no conductive layer had been printed, and were united by being heated at a temperature of 140° C. while subjected to a pressure of 70 kg/cm².

After being degreased 5 hours within a non-oxidizing atmosphere at a temperature of 600° C., the obtained laminates were hot-pressed at 100 to 150 kg/cm² pressure and 1800° C. temperature to produce AlN plate material of 20 mm thickness. This was cut into discoid shapes of 380 mm diameter, and their periphery was polished down until they were 330 mm in diameter.

After that, a wafer pocket of depth equal to that of a wafer 0.8 mm thick and whose diameter was 315 mm was machined into the face on the wafer-carrying side of the discoid items. In doing so, the susceptors were processed likewise as with Embodiment 1, and sample by sample the angle θ that the wafer-pocket circumferential inside face and the wafer-pocket bottom face form, and the curvature R of the bottom-portion circumferential verge where the wafer-pocket circumferential inside face and the wafer-pocket bottom face join was varied as set forth in the following Table V. AlN-ceramic susceptors (of FIG. 2 structure) interiorly having a tungsten resistive heating element and a plasma electrode were produced in this way.

Ceramic-susceptor temperature was elevated to 500° C. by passing an electric current at a voltage of 200 V into the resistive heating element of each of the obtained ceramic susceptors, through two electrodes that were formed on the susceptor surface on the side opposite the wafer-carrying face. Therein, a silicon wafer of 0.8 mm thickness and 304 mm diameter was laid in the wafer pocket in the ceramic susceptors, and the surface temperature distribution was measured to find the isothermal rating. The results obtained are given by sample in Table V below.

TABLE V

| Sample | Angle θ and curvature R (mm) | Wafer-surface isothermal rating (%) at 500° C. | Presence of cracking (N = 5) |
| --- | --- | --- | --- |
| 64* | θ = 80; no R | 0.41 | 3/5 |
| 65* | θ = 90; no R | 0.38 | 2/5 |
| 66 | θ = 90; R = 0.1 | 0.39 | 0/5 |

TABLE V-continued

| Sample | Angle θ and curvature R (mm) | Wafer-surface isothermal rating (%) at 500° C. | Presence of cracking (N = 5) |
| --- | --- | --- | --- |
| 67 | θ = 91; no R | 0.39 | 0/5 |
| 68 | θ = 91; R = 0.1 | 0.38 | 0/5 |
| 69 | θ = 110; R = 0.1 | 0.42 | 0/5 |
| 70 | θ = 135; no R | 0.45 | 0/5 |
| 71 | θ = 150; no R | 0.47 | 0/5 |
| 72 | θ = 170; no R | 0.49 | 0/5 |
| 73* | θ = 175; no R | 0.66 | 0/5 |

Note:
Samples marked with an asterisk (*) in the table are comparative examples.

As will be understood from Table V above, also in aluminum-nitride ceramic susceptors having a resistive heating element and a plasma electrode, by either making the angle θ that the circumferential inside face of a wafer pocket, shaped in the susceptor wafer-carrying face, and the bottom face of the wafer pocket form be 90°<θ≦170°, or the curvature R of the circumferential verge of the bottom portion of the wafer pocket be R≧0.1 mm, the isothermal rating in the face of wafers during wafer heating can be brought to within ±0.5%, without occurrence of cracking in the ceramic susceptors.

A ceramic susceptor for semiconductor manufacturing equipment is realized in accordance with the present invention, in which a wafer pocket for accommodatingly carrying a wafer is provided in the ceramic susceptor, and according to how the pocket contour is devised, thermal radiation from the circumferential surface of a wafer it carries can be kept under control, with no cracking in the ceramic susceptor while it is employed for heating.

Only selected embodiments have been chosen to illustrate the present invention. To those skilled in the art, however, it will be apparent from the foregoing disclosure that various changes and modifications can be made herein without departing from the scope of the invention as defined in the appended claims. Furthermore, the foregoing description of the embodiments according to the present invention is provided for illustration only, and not for limiting the invention as defined by the appended claims and their equivalents.

What is claimed is:

1. A ceramic susceptor for semiconductor manufacturing equipment, the ceramic susceptor comprising:
    a ceramic substrate, one side thereof having a wafer-retaining face;
    a resistive heating element provided either superficially or interiorly in said substrate; and
    a recess formed in said wafer-retaining face with room to carry a semiconductor manufacturing wafer, said recess constituted by a perimetric wall and a bottom face the entirety of which is planar, and being shaped such that the perimetric wall meets the bottom face to form an angle greater than 90° and less than 170° and so that the perimetric wall and the bottom face join in a circumferential verge having a radius of curvature of 0.1 mm or more, the bottom face being sized to receive a back side of the wafer such that the entire back side is in contact with the bottom face.

2. A semiconductor-manufacturing-equipment ceramic susceptor as set forth in claim 1, wherein said ceramic substrate is made of at least one selected from the group consisting of: aluminum nitride, silicon nitride, aluminum oxynitride, and silicon carbide.

3. A semiconductor-manufacturing-equipment ceramic susceptor as set forth in claim 1, wherein said resistive heating element is made from at least one selected from the group consisting of: tungsten, molybdenum, platinum, palladium, silver, nickel, and chrome.

4. A semiconductor-manufacturing-equipment ceramic susceptor as set forth in claim 2, wherein said resistive heating element is made from at least one selected from the group consisting of: tungsten, molybdenum, platinum, palladium, silver, nickel, and chrome.

5. A semiconductor-manufacturing-equipment ceramic susceptor as set forth in claim 1, further comprising a plasma electrode disposed either superficially or interiorly in said ceramic substrate.

6. A semiconductor-manufacturing-equipment ceramic susceptor as set forth in claim 2, further comprising a plasma electrode disposed either superficially or interiorly in said ceramic substrate.

7. A semiconductor-manufacturing-equipment ceramic susceptor as set forth in claim 3, further comprising a plasma electrode disposed either superficially or interiorly in said ceramic substrate.

8. A semiconductor-manufacturing-equipment ceramic susceptor as set forth in claim 4, further comprising a plasma electrode disposed either superficially or interiorly in said ceramic substrate.

* * * * *